(12) United States Patent
Grossman et al.

(10) Patent No.: US 11,512,943 B2
(45) Date of Patent: Nov. 29, 2022

(54) OPTICAL SYSTEM AND METHOD FOR MEASURING PARAMETERS OF PATTERNED STRUCTURES IN MICRO-ELECTRONIC DEVICES

(71) Applicant: NOVA LTD., Rehovot (IL)

(72) Inventors: Danny Grossman, Herzliya (IL); Shahar Gov, Rehovot (IL); Moshe Vanhotsker, Nechusha (IL); Guy Engel, Herzliya (IL); Elad Dotan, Talmei Yehiel (IL)

(73) Assignee: NOVA LTD, Rehovot (IL)

( * ) Notice: Subject to any disclaimer, the term of this patent is extended or adjusted under 35 U.S.C. 154(b) by 779 days.

(21) Appl. No.: 16/462,247

(22) PCT Filed: Nov. 23, 2016

(86) PCT No.: PCT/IL2016/051263
§ 371 (c)(1),
(2) Date: May 20, 2019

(87) PCT Pub. No.: WO2018/096526
PCT Pub. Date: May 31, 2018

(65) Prior Publication Data
US 2019/0339068 A1   Nov. 7, 2019

(51) Int. Cl.
*G01B 11/24* (2006.01)
*H01L 21/66* (2006.01)
*G01N 21/95* (2006.01)

(52) U.S. Cl.
CPC .............. *G01B 11/24* (2013.01); *H01L 22/12* (2013.01); *G01N 21/9501* (2013.01)

(58) Field of Classification Search
CPC .. G01B 11/24; G01B 9/04; G01N 2021/8438; G01N 21/9501; G01N 21/95623; H01L 22/12
See application file for complete search history.

(56) References Cited

U.S. PATENT DOCUMENTS

| 2004/0075837 A1 | 4/2004 | Maeda et al. |
| 2009/0213377 A1 | 8/2009 | Scheiner et al. |

(Continued)

FOREIGN PATENT DOCUMENTS

WO   2016020925 A1   2/2016

*Primary Examiner* — Hina F Ayub
(74) *Attorney, Agent, or Firm* — Alphapatent Associates, Ltd; Daniel J. Swirsky

(57) ABSTRACT

An optical system and method are presented for use in measurements on an upper surface of a layered sample when located in a measurement plane. The optical system is configured as a normal-incidence system having an illumination channel and a collection channel, and comprises an objective lens unit and a light propagation affecting device. The objective lens unit is accommodated in the illumination and collection channels, thereby defining a common optical path for propagation of illuminating light from the illumination channel toward an illuminating region in the measurement plane and for propagation of light returned from measurement plane to the collection channel. The light propagation affecting device comprises an apertured structure located in at least one of the illumination and collection channels, and configured to provide angular obscuration of light propagation path for blocking angular segments associated with light propagation from regions outside the illuminated region.

6 Claims, 6 Drawing Sheets

(56) References Cited

U.S. PATENT DOCUMENTS

| | | |
|---|---|---|
| 2013/0148114 A1 | 6/2013 | Berlatzky et al. |
| 2013/0308131 A1 | 11/2013 | Barak et al. |
| 2014/0168646 A1 | 6/2014 | Barak et al. |
| 2014/0376006 A1 | 12/2014 | Scheiner |
| 2015/0377797 A1* | 12/2015 | Kolchin ................ G01N 21/47 |
| | | 356/237.5 |

* cited by examiner

OPTICAL SYSTEM AND METHOD FOR MEASURING PARAMETERS OF PATTERNED STRUCTURES IN MICRO-ELECTRONIC DEVICES

TECHNOLOGICAL FIELD

The present invention relates to system and methods for non-destructive quality control, and in particular, to optical systems and methods for measuring patterned structures used in microelectronic device.

BACKGROUND

Various optical instruments are known in the art for measuring and inspecting microelectronic devices, and for measuring morphological and physical parameters of the microelectronic devices. For example, spectral reflectometers has been demonstrated to be a powerful tool for characterization of materials, and has been used in the semiconductor industry for control of the fabrication process.

Microelectronic devices are usually fabricated on silicon substrates which are transparent to the specific wavelength(s) (e.g. in the IR spectral range) of optical radiation at which measurements could provide desired information on the device structure. In measurements carried out utilizing conventional optical measurement systems, light incident on the front surface of the device is not absorbed within the substrate, but rather continues to propagate inside the substrate, and is then partially reflected back from the rear surface of the substrate, and then propagates back to and through the front surface, where this backside reflection is collected and further measured along with the front surface reflection originated from the front surface of the device. Thus, a parasitic signal in the form of a ghost reflection of light originated from the rear surface of the device is present along with the front surface reflection in the measurement of the sample; whilst it is desirable to measure only light that is reflected from the front surface.

EP 1 212 580 to Rosenthal etc. describes a method and apparatus for performing precise optical measurements of layers and surface properties both transparent and also non-transparent substrates. A field stop aperture in a confocal optical configuration is used to define the illumination area, and another aperture is used to accept light reflected form the front surface of a sample being analyzed, while blocking or rejecting the ghost reflection from the backside.

GENERAL DESCRIPTION

The invention is aimed at improving measurements on a sample by eliminating or at least significantly reducing bottom reflections in the detected/measured signal. Such bottom reflections include ghost reflection signals, and are associated with one or more light interaction interfaces downstream the upper/top surface of the sample (which is the surface of interest being measured.

As will be described more specifically further below, there are cases where the sample is partially or fully transparent for some or all of the optical system operating wavelengths, for example semiconductor silicon wafers where the light of NIR wavelengths is not absorbed in silicon. In such cases, incident light is not absorbed within the sample but rather continues to propagate inside the sample and is partially reflected back from the bottom as well as from intermediate interfaces of the sample, and when output through the top surface, presents a parasitic signal which is to be separated from the top surface reflection.

Generally, the parasitical reflection from the bottom interface can be reduced/eliminated by reducing the size of the collection and/or illumination fields. This approach, however, cannot be used in an imaging system, where large fields are required. In a non-imaging system, reducing field size results in such an unwanted effect as reduction of the flux of light in illumination and collection and thus reduction of the system efficiency (i.e. reduction of the system throughput).

Another general solution is to increase the numerical aperture of the system. This will reduce the optical depth of focus (DOF), thus reducing the efficiency of the collected parasitic reflection. This approach, however, has limited success in reducing the bottom reflection.

Yet further possible solution is to introduce a tilt to the illumination and collection channels (so that light is not hitting the sample at normal incidence), where the tilt value is determined by the thickness of the sample, the refractive index of the bulk material of the sample, and the detector/source size. More specifically, the reflection from the bottom can be displaced partially or completely away from the collection field/channel. With this approach, however, the required tilt may be unreasonably large for a system for measuring a sample. This may induce, for example, in an imaging system, a well-known Schiemflug defocus effect and also distort the field of view. These can be corrected to some extent, but involve cost and elevated complexity. This approach will also introduce system level limitations, such as increased sensitivity to focus error, resulting from bore sight shifting of the illumination and collection in opposite direction due to focus error.

The present invention provides a novel solution, which is all-optical solution/configuration that significantly reduces unwanted reflection from the bottom interface(s) of a transparent sample. This approach consists of using angular obscuration of light propagation path blocking angular segments associated with light propagation from regions outside the focal spot on a measurement plane. The size of the obscuration is determined by the thickness of the sample, the refractive index of the bulk material in the sample, and the detector/source size (the size of the illumination spot and image of the detection surface onto the sample plane).

Thus, according to a broad aspect of the invention, it provides an optical system for use in measurements on an upper surface of a layered sample when located in a measurement plane. The optical system is configured as a normal-incidence system having an illumination channel and a collection channel, and comprises an objective lens unit defining a common optical path for propagation of illuminating light from the illumination channel toward an illuminating region in the measurement plane and for propagation of light returned from measurement plane to the collection channel, and a light propagation affecting device. This device comprises an apertured structure located in at least one of the illumination and collection channels, and configured to provide angular obscuration of light propagation path for blocking angular segments associated with light propagation from regions outside said illuminated region.

In some embodiments, the apertured structure comprises at least one mask having a pattern of light transmitting and blocking regions. In one example, such mask(s) may be located in the illumination channel and configured such that the angular segments of propagation of light associated with location of ghost spots are prevented from reaching the collection channel, e.g. to prevent illumination of the ghost spots' locations. In another example, the mask(s) is/are located in the collection channel.

In some embodiments, the apertured structure comprises first and second masks having first and second different patterns arranged in a spaced-apart relationship along the illumination channel at input and output planes, respectively of a relay optics unit.

The aperture structure is configured to provide a predetermined size of the obscuration, which is determined by one or more of the following: the thickness of the sample, the refractive index of the bulk material in the sample, and the detector/source size.

The present invention also provides a method for use in optical measurements on an upper surface of a layered sample when located in a measurement plane. The method comprises: performing optical measurements on the sample using a normal-incidence mode, by directing illuminating light to the sample via an illumination channel and collecting light returned from an illuminated region on the sample and propagating along a collection channel, and applying angular obscuration of a light propagation path along either one or both of the illumination and the collection channels to block angular segments associated with light propagation from regions outside the illuminated region.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
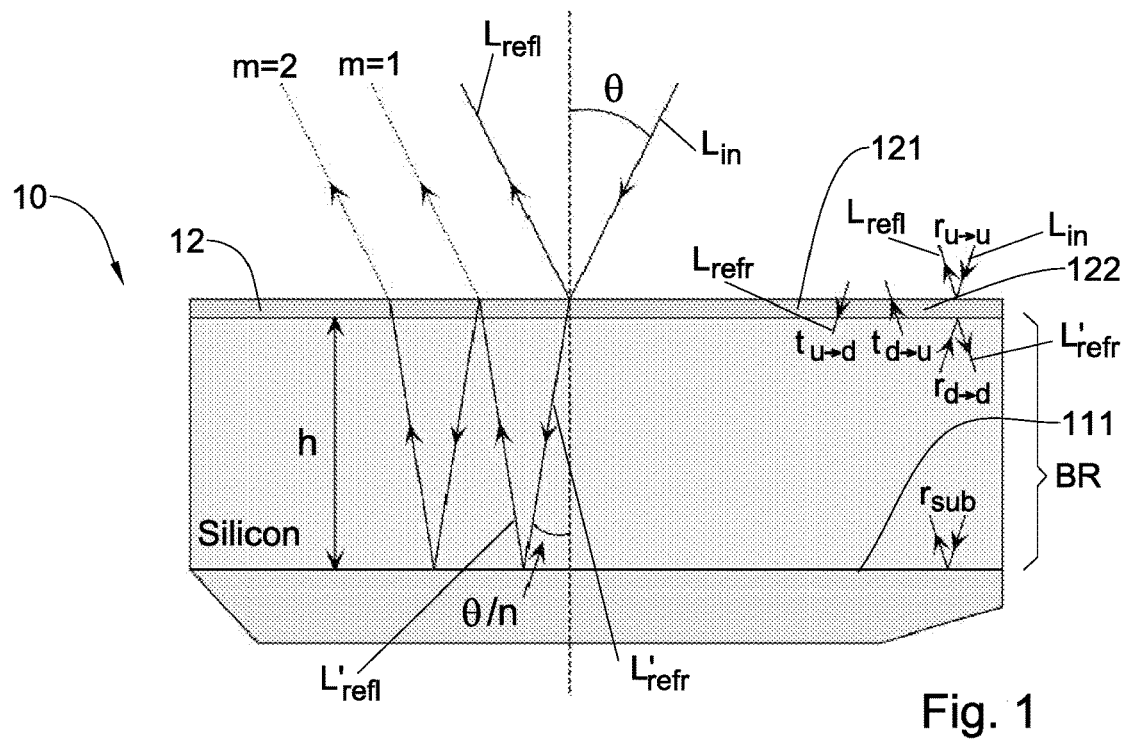
FIG. 1 schematically shows an optical scheme of light propagation onto and through a sample having multiple light interaction interfaces, showing light transmission and reflectance at each interface.

The principles of construction and operation of the optical system according to the present invention may be better understood with reference to the drawings and the accompanying description, wherein like reference numerals have been used throughout to designate identical elements, it being understood that these drawings which are not necessarily to scale, are given for illustrative purposes only and are not intended to limit the scope of the invention. Examples of constructions, materials, dimensions, and manufacturing processes are provided for selected elements. Those versed in the art should appreciate that many of the examples provided have suitable alternatives which may be utilized.

Reference is made to FIG. 1, which schematically illustrates a light propagation scheme for a light beam interacting with a patterned sample 10. The patterned sample 10, such as a semiconductor wafer, typically includes a substrate 11 (single- or multi-layer substrate) having thickness h, which is covered with an upper layer 12, e.g. patterned layer. The reflected signal that one is usually interested at, is the one that is reflected back from the upper patterned layer.

As shown in FIG. 1 in a self-explanatory manner, input light beam $L_{in}$ is partially reflected $L_{refl}$ from the an upper surface/interface 121 of the upper layer 12 (constituting a front surface of the sample), and is partially refracted $L_{refr}$ by the upper surface 121, to propagate through the layer 12 and be refracted $L'_{refr}$ at an intermediate interface 122 between the layer 12 and the substrate 11. This light portion $L'_{refr}$ may then be reflected back $L'_{refr}$ from an inner surface (lower interface) 111 of the rear side of the substrate 11.

Thus, light (plane-wave) propagating through the sample 10 successively undergoes reflection/refraction at the interfaces 121, 122 and 111. The effective reflection $r_{eff}$ for an incidence plane-wave propagating in a direction theta θ can be evaluated via the following equation (1):

$$r_{eff}(\theta) = r_{u \to u} + t_{d \to u} t_{u \to d} r_{sub} \sum_{m=1}^{\infty} r_{d \to d}^{m-1} \exp\left(+2jmk_0\sqrt{n^2 - \sin^2\theta h}\right) \exp\left(-\frac{2k_0 n \kappa m h}{\sqrt{n^2 - \sin^2\theta}}\right) r_{sub}^{m-1}$$

Here:
$k_0$ is the wavenumber;
n is the refractive index of the bulk material;
κ is the extinction coefficient of the bulk material;
θ is the incidence angle;
$r_{sub}$ is the complex reflectance from the rear surface 111 of the substrate 11;
$r_{u \to u}$ is the complex reflectance from the front surface 121 of the upper layer 12 (under the assumption that no rear surface is present); this is the desired error-free signal;
$r_{d \to d}$ is the complex reflectance from the intermediate interface 122 of the upper layer 12 (under the assumption that no source is present at the front surface 121 of the upper layer 12, so for the purpose of the definition of $r_{d \to d}$, the interface 122 is illuminated only from below);
$t_{u \to d}$ is the complex transmission from the front surface 121 to the interface 122 between the upper layer 12 and substrate 11 (under the assumption that no source is present at the interface 122 or below that surface, so for the purpose of the definition of $t_{u \to d}$, a source is present only above interface 121);
$t_{d \to u}$ is the complex transmission from the intermediate interface 122 (lower surface of layer 12) to the front surface 121 of the upper layer 12 (under the assumption that a source is present only below interface 122).

It should be noted that the summation over the reflection components of orders m (m=1, 2, 3, etc.) which are termed herein after as "ghost of order 1", "ghost of order 2", "ghost of order 3", etc., represents single or multiple (double, triple, etc.) reflections 13 from the rear surface 111, accompanied by multiplication with transmissions/reflections of the light beam across the upper layer 12 and the bulk volume of the substrate 11 between the front surface 121 of the upper layer 12 and the rear surface 111 of the substrate 11.

Figure 3:
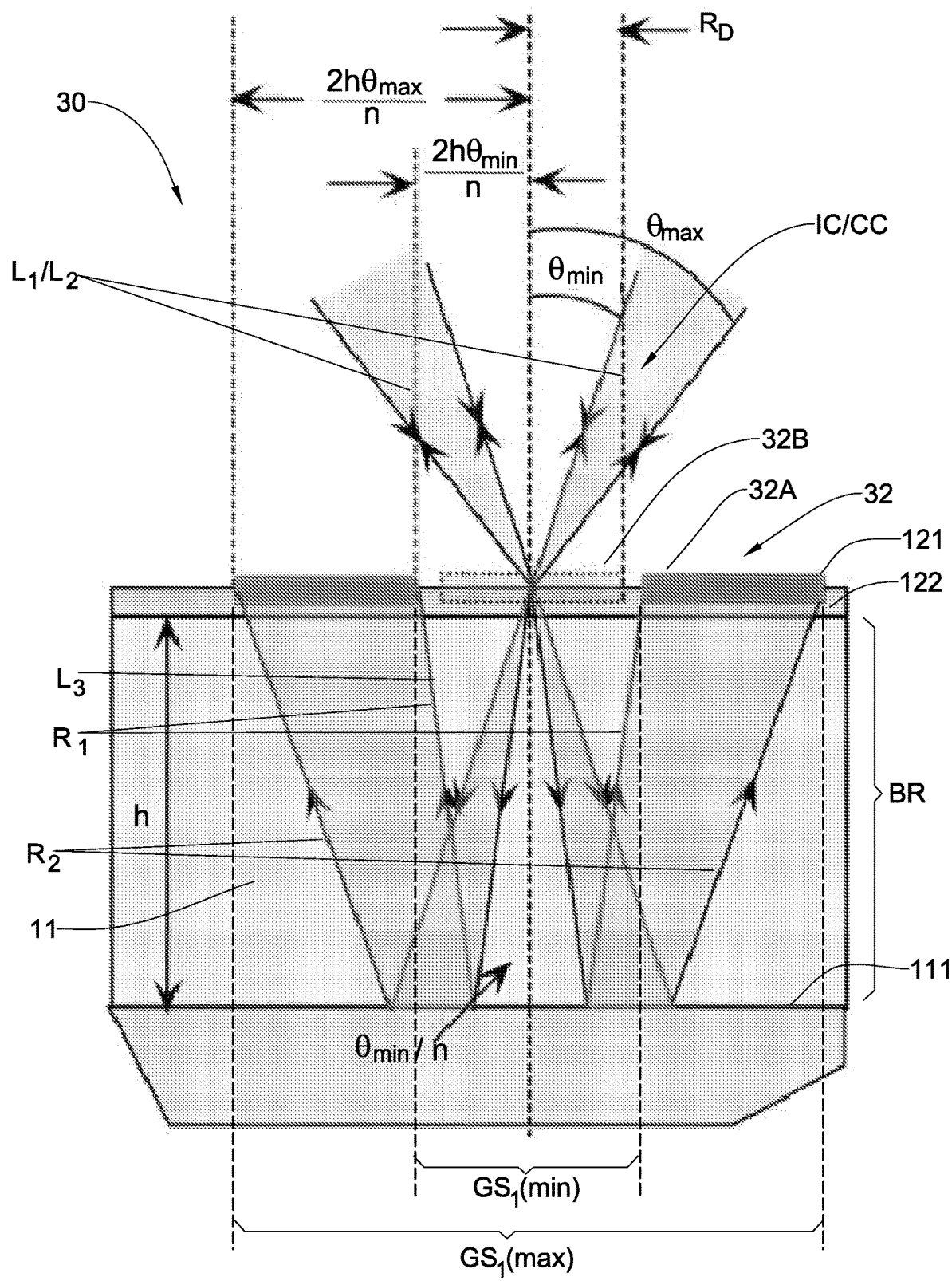
FIG. 3 schematically illustrates a light propagation scheme underlying the principles of the invention where angular obscuration is tuned such that the reflection from the bottom of the sample does not reach the detector.

FIG. 3, which illustrates the principles of the invention and will be described more specifically further below, depicts the relation of the ghosts lateral dimension at sample plane, to that of the dimension of the detector and/or source (after being imaged to the sample plane). By geometrical considerations, the ghosts cannot enter the detector provided that the incidence angle is large enough. The minimal incidence angle for which ghost intrusion is marginal depends on both source and detector size (i.e. illumination and collection spot sizes), on the thickness of the bulk material, and on its refractive index. The relation between these parameters is given by:

$$\theta_{min} > \frac{n(R_S + R_D)}{4h}$$

where:

$R_S$ is the source radius as imaged onto the sample plane (i.e. illumination spot size);

$R_D$ is the detector radius as imaged onto the sample plane (i.e. detection spot size); and h is the sample's thickness.

It should be noted that the expression given above relies on Geometrical optics approximation, and does not take into account diffraction effects. Diffraction effects will be taken into account in the next given expressions.

Generally, an optical system, for directing input light towards the sample and collecting light returned from the sample to a detector, defines different illumination and collection spot sizes. Typically, however, either the illumination or the collection optics determines the spot-size. Also, since such optical system has a finite angular range (numerical aperture) for both the collection and illumination arms, the overall light field at the upper surface 121 of the sample 10 is given by multiplying the above expression (1) with a plane wave of proper lateral dependence followed by an integral over all possible illumination directions.

Then, equation (1) above can be used to evaluate the spatial lateral distribution of the light field's intensity. This lateral distribution of the field can then be integrated over the image of the detector on the upper surface 121. This yields an expression for the overall signal collected by the optical system onto a detection region of radius $R_D$ which takes into account diffraction effects, and which is given by the following equation (2):

$$R_{eff} \simeq |r_{u \to u}|^2 + \sum_{m=1}^{\infty} \exp(-4k_0 \kappa m h) \frac{G^{(m)}(k_0, \theta_{max})}{G^{(0)}(k_0, \theta_{max})} |t_{d \to u} t_{u \to d} r_{sub} (r_{d \to d} r_{sub})^{m-1}|^2$$

wherein $G^{(m)}$ is the geometrical and diffraction areal factor collected by detector for ghost m, and is a function of $g^{(m)}$ being the geometrical and diffraction radial distribution of the field at the detector plane for ghost m, defined by the following equations (3):

$$g^{(m)}(r; k_0, \theta_{max}) \equiv 2\pi \int_0^{\theta_{max}} d\theta \theta J_0(k_0 r \theta) \exp\left(-jmk_0 \frac{\theta^2}{n} h\right) =$$

$$\left\{ \begin{array}{l} \text{The geometrical + diffraction radial} \\ \text{Distribution of the field at the} \\ \text{detector plane for ghost } m \end{array} \right\}$$

$$G^{(m)}(k_0, \theta_{max}) \equiv 2\pi \int_0^{R_D} r |g^{(m)}(r; k_0, \theta_{max})|^2 dr =$$

$$\left\{ \begin{array}{l} \text{The geometrical + diffraction areal-factor} \\ \text{collected by detector for ghost } m \end{array} \right\}$$

$R_D$ = {Detector radius}
$\kappa$ = {The extinction coefficient of the bulk material}
$n$ = {The refractive index of the bulk material}
$\theta_{max} = \left\{ \begin{array}{l} \text{The maximal inclination angle of illumination } NA \\ \text{given by } \theta_{max} = \sin^{-1}(N.A.) \end{array} \right\}$
$m$ = {Ghost order $m = 1, 2, 3, \ldots$}
$J_0(x)$ = {The $0^{th}$-order Bessel function of the first kind}

The first term in the above expression (2), $r_{u \to u}$, represents the reflection from the upper layer 12 that is to be measured for determination of the parameters of a pattern in the front surface 121 of the upper layer 12, whilst the second term contains all the ghost reflection signals from the intermediate and lower interfaces 122 and 111 of the sample 10. The expression above is derived under the assumption that cross-terms that mix amplitudes from different ghosts are smeared out over the detector, as these contain fast lateral oscillations. Another assumption that was used is that the angular dependence of the different reflectances weakly depends on the angle-of-incidence. Yet another assumption is that the sample scatter the signal specularly (so that the scattered direction, as measured from normal to the sample plane, is equal to the incidence direction).

Figure 2:
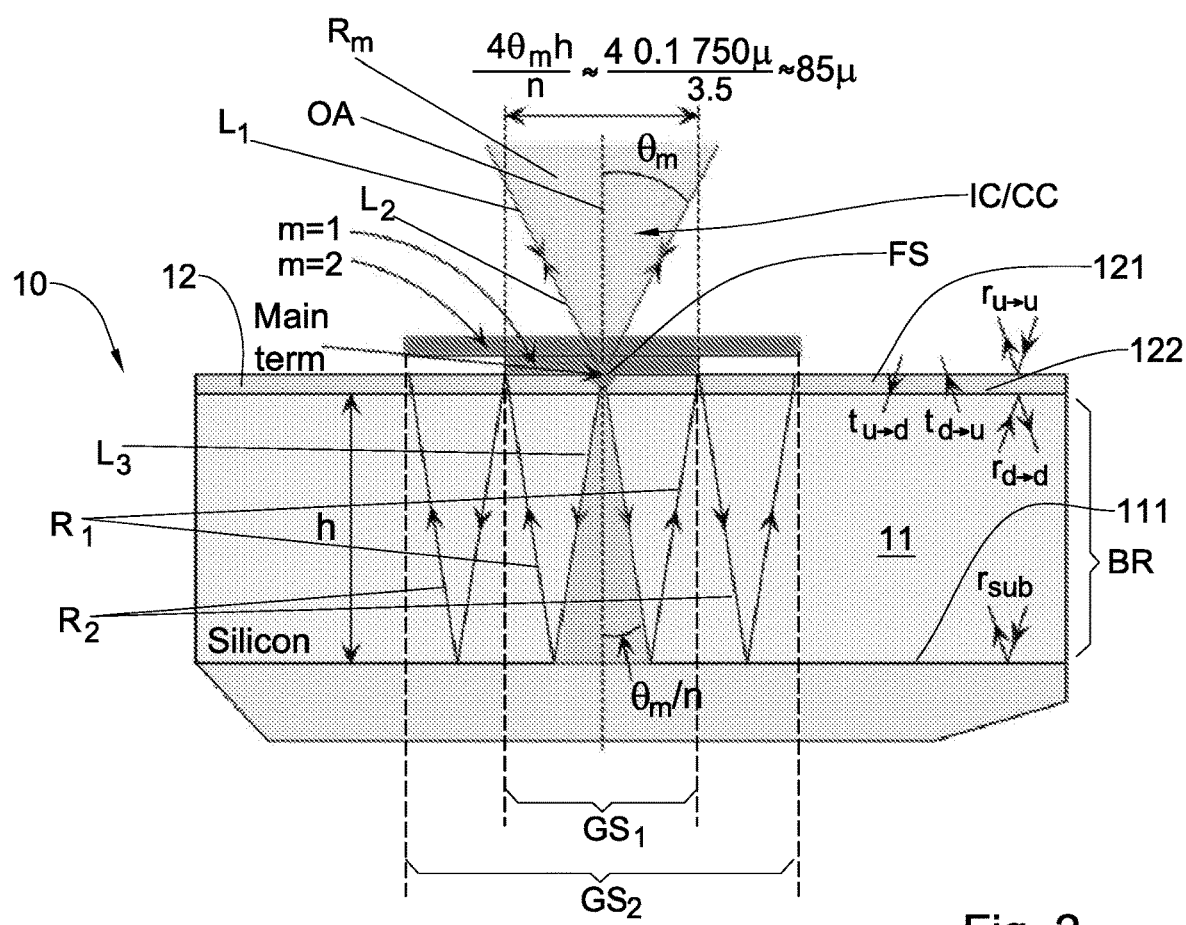
FIG. 2 schematically illustrates collection of light components returned from a sample having multiple light interaction interfaces (hereafter called "ghosts"), and their lateral spread over the upper sample plane.

FIG. 2 illustrates a light propagation scheme to, through, and from the sample 10 using a conventional optical system of a normal-incidence configuration. In the normal-incidence configuration, an illumination path/channel IC and a collection path/channel CC have a common portion where they substantially coincide being aligned parallel to the optical axis OA defined by an objective lens unit common for these paths. As shown, illuminating light beam $L_1$ is focused (by the objective) with angle $\theta_{max}$ on a focal spot FS on the upper surface 121 of the sample 10 (i.e. its upper/top layer 12), thus producing the "main term" reflection $R_m$ formed by light component $L_2$ propagating along the collection channel. Also, interaction between input light $L_1$ and interface 121 results in refraction providing refracted light component $L_3$ entering the layer 12, and by further refraction of light at the interface 122, entering the substrate bulk 11 towards the rear surface 111 which reflects light back causing multiple successive reflections—only two such reflections $R_1$, $R_2$ are shown in the figure. The so produced multiple reflections $R_1$ and $R_2$, when interacting with the upper surface 121 (light collection surface), form respective "ghost" spots $GS_1$ and $GS_2$.

In the conventional configuration of the normal-incidence optical system, such ghost spots $GS_1$ and $GS_2$ are unavoidably imaged onto the areas in the detection plane much larger than the area of the focal spot FS. Thus, the reflection response of the sample to illuminating light $L_1$ detectable by the conventional optical system includes reflection $R_m$ corresponding to the main term reflection, and multiple reflections $R_1$, $R_2$ corresponding to multiple reflection terms m=1 and m=2. It should be understood that, as the upper layer 12 is relatively thin (as compared to the substrate 11), the effect of light interaction with (reflection/refraction at) the intermediate interface 122 is negligible.

Reference is now made to FIG. 3 exemplifying the principles of light propagation in an optical system 30 of the invention. The optical system 30 utilizes normal-incidence optics, i.e. illumination and collection paths/channels IC and CC having a common/coinciding portion aligned parallel to the optical axis OA defined by a common objective lens unit (which is not specifically shown in this figure), for propagation of illuminating light from the illumination channel IC toward an illuminating region in the measurement plane and for propagation of light returned from measurement plane to the collection channel CC.

As shown, input light $L_1$ is incident onto top surface 121 of the sample and is partially reflected $L_2$ and partially refracted $L_3$, and then undergoes multiple bottom/top reflections $R_1$, $R_2$, etc. from interfaces 111 and 122 inside the sample, as described above.

According to the invention, the optical system 30 is configured with obscured angular extent of light propagation. The angular extent of light propagation used in the system which is confined between angles $\theta_{min}$ and $\theta_{max}$ creates bottom reflected ghosts, of which ghosts $GS_1(min)$ and $GS_1(max)$ only are shown in the figure for simplicity. These ghost spots are obscured and thus prevented from being collected to the detector. For this case, the expression (2) written above for the overall intensity at the detector should be modified to take into account obscuration. The only difference in the expression occurs at the definition of G, which is now given by equations (4):

$$g^{(m)}(r; k_0, \theta_{max}, \theta_{min}) \equiv 2\pi \int_{\theta_{min}}^{\theta_{max}} d\theta \theta J_0(k_0 r \theta) \exp\left(-jmk_0 \frac{\theta^2}{n} h\right)$$

$$G^{(m)}(k_0, \theta_{max}, \theta_{min}) \equiv 2\pi \int_0^{R_D} r |g^{(m)}(r; k_0, \theta_{max}, \theta_{min})|^2 dr$$

To this end, the system 30 of the invention includes a light propagation affecting device 32 comprising at least one apertured element located in either one or both of the illumination and collection channels IC and CC. Such aperture element(s) is/are configured to block light portions of the returned light propagating from regions on the sample outside the upper surface of the sample. More specifically, as exemplified in the figure, the light blocking element (i.e. obscuration stop) is actually a mask having blocking regions which block angular segments 32A of propagation of light returned from ghost spots' locations, and having an optical window 32B for the focal spot propagation path. The optical window 32B is an optically transparent region, which may be constituted by an aperture (opening) or by a physical element separating optics from the sample. The region 32B presents an image of the detector onto the sample plane. In this figure, which exemplifies a "good" design, it is shown that the size of the detector's image is slightly smaller than the region where the first ghost start to appear (at sample plane).

In the description below, the ghost reflection signals, described above, are referred to as "bottom reflection", although as can be understood from the description above such bottom reflection is associated with one or more light interaction interfaces downstream the upper surface of interest (with respect to general input light propagation direction).

Thus, the present invention provides a novel design of the optical system which is a normal-incidence system (i.e. illumination and collection paths having a substantially coinciding portion and having common objective lens unit), and is configured to eliminate or at least significantly reduce amount of ghost reflection signals in the collected light returned from the sample. This eliminates a need for estimating the ghost reflection signals to be further subtracted from the detected light and/or modeling—in the ghost signal to get the overall signal.

The technique of the invention, i.e. light collection with the obscured angular extent, can be implemented in various system configurations. This is exemplified in FIGS. 4 to 6. To facilitate illustration and understanding, the same reference numbers are used for identifying functional components that are common in all the examples.

Figure 4:
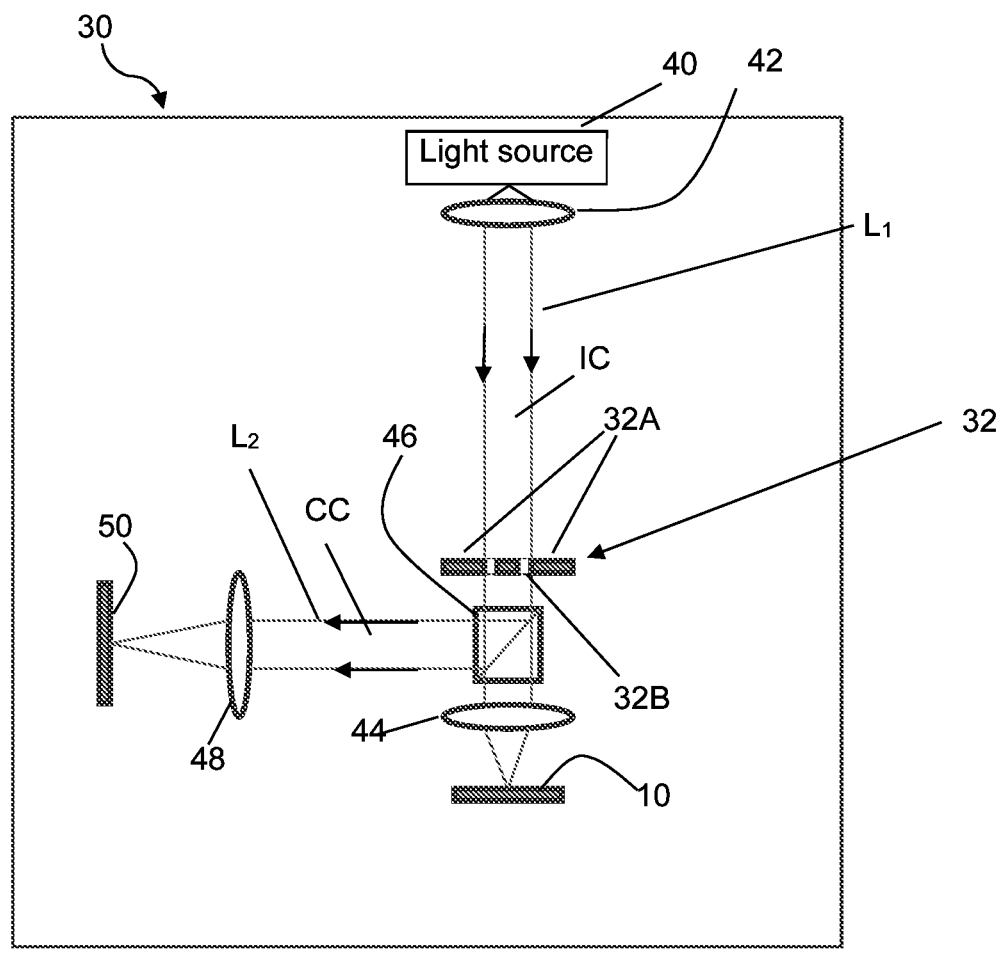
FIGS. 4 to 6 illustrate three examples, respectively, of the configuration of the optical system of the invention.

FIG. 4 is a block diagram of an optical system 30 which is normal incidence system in which a light propagation affecting device 32 performing angular obscuration is accommodated in the illumination channel IC. More specifically, system 30 includes illumination channel IC associated with a light source 40, collection channel CC associated with a light detection unit defining a detection plane 50, an objective lens unit 44, and apertured structure/element 32 performing angular obscuration. Also optionally provided is a collimator 42 associated with the light source 40 (collimator may be part of the light source unit), and imaging optics 48 in front of the detection plane 50 (imaging optics may be part of the detection unit). As further shown in the figure, a beam splitter/combiner 46 is provided, which is accommodated in the common portion of the illumination and collection channels. In this example, the beam splitter works in transmission mode in the illumination channel and in reflection mode in the collection channel, but it can be the other way around. The light beam $L_1$ propagates along the illumination channel and passes through the pattern (mask) of the angular obscuration element 32. The latter is configured as described above, having blocking regions 32A aligned with angular segments of propagation of light associated with ghost spots' locations, and optical windows 32B aligned with the focal spot propagation path. Preferably, the obscuration element 32 is placed at the back-focal plane of the objective 44. The beam splitter/combiner 46 transmits light portions of the input $L_1$ that have passed through the optical windows 32B towards the objective to be focused onto the focal plane in the measurement plane where the sample 10 is located; and reflects light being returned from the sample 10 to propagate along the collection channel to the detection plane. Thus, in this example, where the apertured structure/element 32 is located in the illumination channel, the angular obscuration is actual, i.e. angular segments of propagation of light associated with ghost spots' locations (outside the focal spot) are prevented from being detected by preventing illumination of such ghost spots' location.

Figure 5:
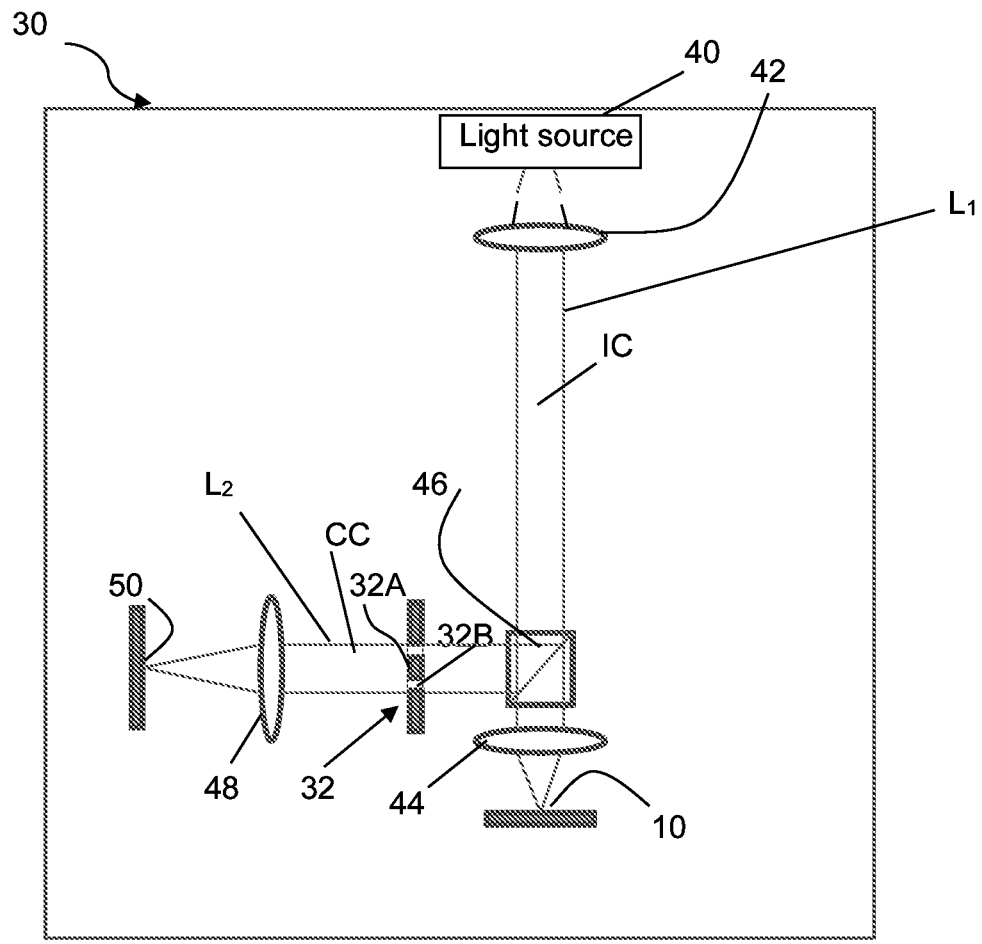

FIG. 5 is a schematic illustration of an optical system 30 which is normal incidence system in which a light propagation affecting device 32 performing angular obscuration is accommodated in the collection channel CC. Similar to the example of FIG. 4, the system includes illumination channel IC associated with a light source 40 and possibly a collimator 42; collection channel CC associated with a light detection unit defining a detection plane 50 possibly associated with an imaging lens unit 48; a beam splitter/combiner 46; and an objective lens unit 44, and apertured structure/element 32 performing angular obscuration. The apertured element 32 is accommodated in the collection channel CC being in the optical path of returned light $L_2$ reflected by the beams splitter/combiner towards the detection plane. The apertured element 32 is a mask having light blocking regions 32A aligned with angular segments of propagation of light associated with (returned from) ghost spots' locations, and optical windows 32B aligned with the focal spot propagation path. In this example, where the apertured structure/element 32 is located in the collection channel, the angular segments of propagation of light returned from the ghost spots' locations (outside the focal spot) are prevented from reaching the detector by blocking regions 32A of the apertured element 32.

Figure 6:
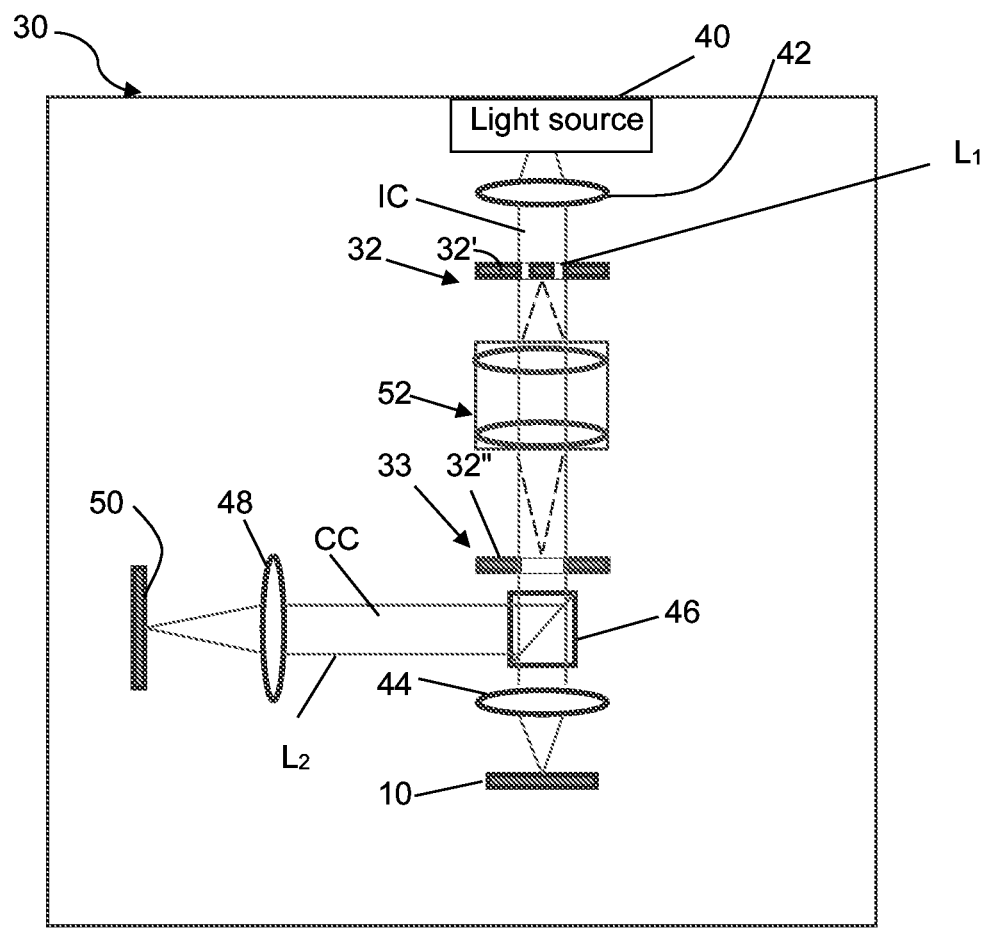

FIG. 6 schematically illustrates an optical system 30 in which the apertured device 32 is located in the illumination channel and is configured such that angular obscuration is imaged onto intermediate planes (32, 33) upstream of the objective lens unit, such that angular segments of propagation of light associated with ghost reflections are prevented from reaching the objective and the sample. This approach is similar to that of FIG. 4, but here the apertured device 32 is a two-part device formed by two masks 32' and 32" accommodated in a spaced-apart relationship along the illumination channel and being in input and output planes of a relay optics unit 52. Thus, similar to the examples of FIGS. 4 and 5, the system 30 of FIG. 6 includes illumination channel IC associated with a light source 40 and possibly a collimator 42; collection channel CC associated with a light detection unit defining a detection plane 50 possibly associated with an imaging lens unit 48; a beam splitter/combiner 46; and an objective lens unit 44, and apertured structure/element 32', 33" performing angular obscuration. The apertured device 32 is accommodated in the illumination channel IC upstream of the objective lens unit 44 (and upstream of the beam splitter 46). In the example of FIG. 6, the apertured device 32 is formed by first and second different masks 32' and 32" and a relay optics unit 52 between them. As shown by dashed lines, the optical path associated with the angular segments of ghost reflections works in the same way as in FIG. 4.

Figures 7A, 7B:
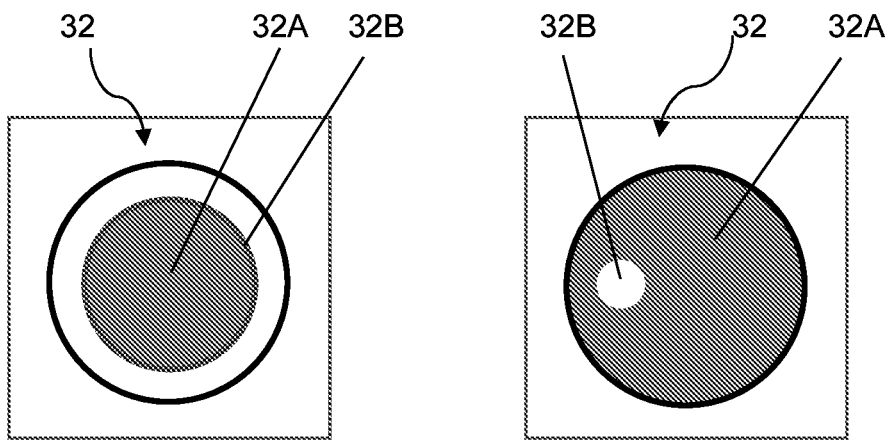
FIGS. 7A and 7B show two examples of the configuration of an aperture stop element suitable to be used in the optical system of the invention.

As exemplified in FIGS. 7A and 7B, the mask 32 (or 32' or 32") may have any suitable pattern of light blocking and transmitting regions 32A and 32B. This may be a shape of a full ring (circular obscuration stop in FIG. 7A) or any other shape (non-symmetrical obscuration stop FIG. 7B) that blocks the unwanted angular extent.

Figure 8:
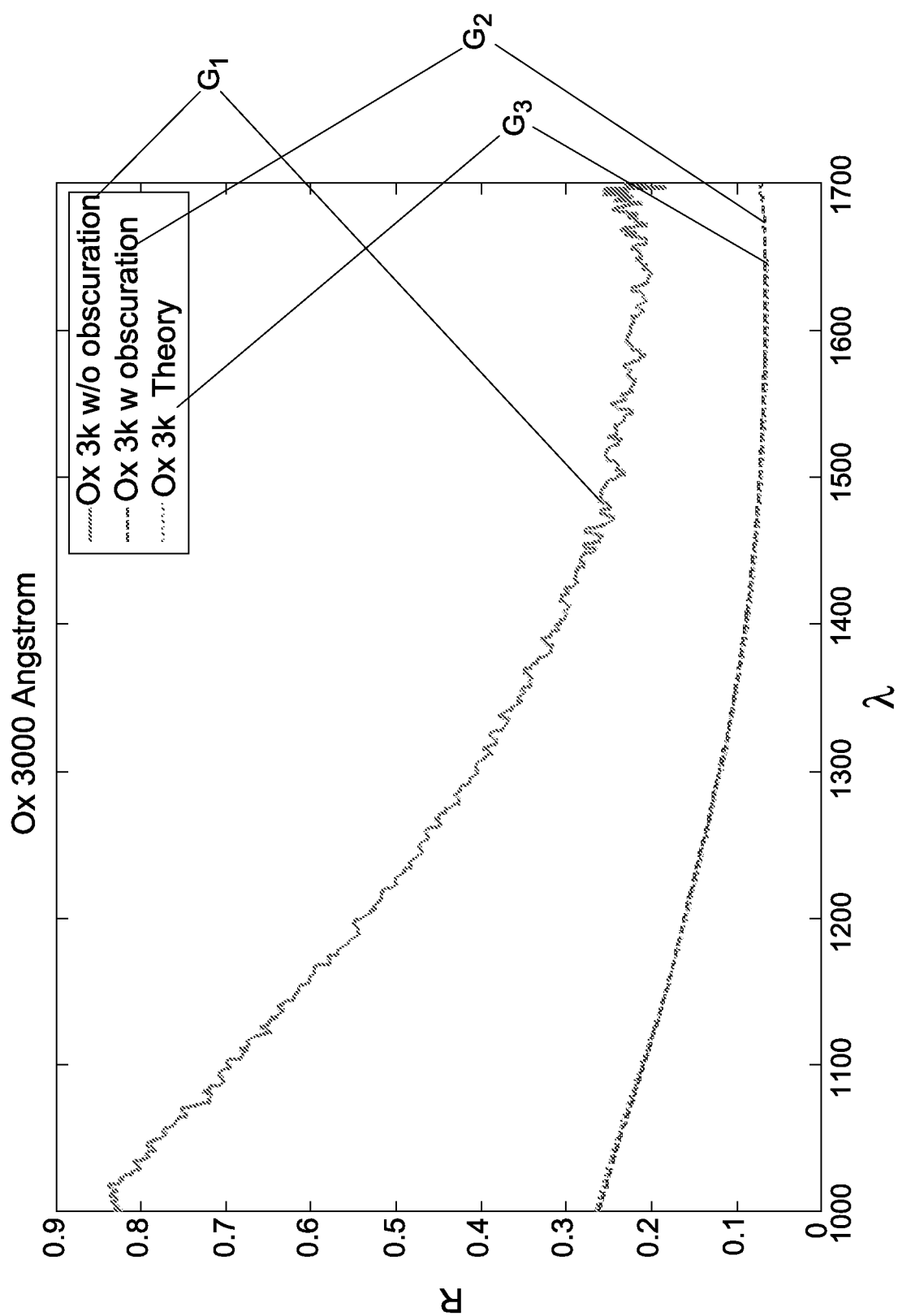
FIG. 8 graphically illustrates correlation between measured and theoretical data for spectral reflectivity using the angular obscuration optical system of the invention, as compared to an optical system with no obscuration.

FIG. 8 graphically illustrates correlation between measured and theoretical data for spectral reflectivity using the angular obscuration optical system of the invention, as compared to an optical system with no obscuration. In this example, a sample is a 3000 Angstrom silicon oxide on bare silicon wafer. Graphs $G_1$ and $G_2$ correspond to the measured spectral reflection from the sample obtained with respectively no obscuration and obscuration approach, with respect to theoretical reflection curve $G_3$ from the sample.

The invention claimed is:

1. An optical system for use in measurements on an upper surface of a layered sample when located in a measurement plane, wherein the optical system is configured as a normal-incidence system having an illumination channel and a collection channel, the optical system comprising:
   an objective lens unit accommodated in the illumination and collection channels, thereby defining a common optical path for propagation of illuminating light from the illumination channel toward an illuminating region in the measurement plane and for propagation of light returned from measurement plane to the collection channel; and
   a light propagation affecting device comprising an apertured structure located in at least one of the illumination and collection channels, and configured to provide angular obscuration of light propagation path for blocking angular segments associated with light propagation from regions outside said illuminated region,
   wherein said apertured structure comprises first and second masks having first and second different patterns arranged in a spaced-apart relationship along the illumination channel at input and output planes, respectively of a relay optics unit,
   wherein the first and second masks have a pattern of light transmitting and blocking regions, and
   wherein the first and second masks are located in the illumination channel and are configured such that the angular segments of propagation of light associated with the locations of ghost spots are prevented from reaching the collection channel.

2. The optical system according to claim 1, wherein the first and second masks are configured to prevent illumination of said ghost spots' locations.

3. The optical system of claim 1, wherein the first and second masks are located in the collection channel.

4. A method for use in optical measurements on an upper surface of a layered sample when located in a measurement plane, the method comprising:
   performing optical measurements on the sample using a normal-incidence mode, by directing illuminating light to the sample via an illumination channel and collecting light returned from an illuminated region on the sample and propagating along a collection channel; and
   applying angular obscuration of a light propagation path along either one or both of the illumination and the collection channels to block angular segments associated with light propagation from regions outside said illuminated region,
   wherein said angular obscuration comprises passing said light through first and second masks having first and second different patterns arranged in a spaced-apart relationship along the illumination channel,
   wherein said angular obscuration comprises passing the light propagating along either one or both of the illumination and collection channels via the first and second masks having a pattern of light transmitting and blocking regions,
   wherein the first and second masks are located in the illumination channel and are configured such that the angular segments of propagation of light associated with the locations of ghost spots are prevented from reaching the collection channel.

5. The method according to claim 4, wherein the first and second masks are configured to prevent illumination of said ghost spots' locations.

6. The method according to claim 4, wherein the first and second masks are located in the collection channel.

* * * * *